United States Patent
You

(10) Patent No.: US 7,977,217 B2
(45) Date of Patent: Jul. 12, 2011

(54) METHOD OF CRYSTALLIZING SILICON

(75) Inventor: JaeSung You, Seoul (KR)

(73) Assignee: LG Display Co., Ltd., Seoul (KR)

( * ) Notice: Subject to any disclaimer, the term of this patent is extended or adjusted under 35 U.S.C. 154(b) by 96 days.

(21) Appl. No.: 10/847,287

(22) Filed: May 18, 2004

(65) Prior Publication Data
US 2004/0253840 A1 Dec. 16, 2004

(30) Foreign Application Priority Data
Jun. 12, 2003 (KR) .................. 10-2003-0037738

(51) Int. Cl.
H01L 21/36 (2006.01)
(52) U.S. Cl. .. 438/486; 438/487; 438/795; 257/E21.497
(58) Field of Classification Search .................. 438/487, 438/486, 482, 795, 798; 257/E21.497
See application file for complete search history.

(56) References Cited

U.S. PATENT DOCUMENTS
6,770,545 B2 * 8/2004 Yang .............................. 438/487
2001/0019863 A1 9/2001 Yang
2002/0179001 A1 12/2002 Jung
2002/0179004 A1 12/2002 Jung
2003/0088848 A1 5/2003 Crowder
2003/0196589 A1 * 10/2003 Mitani et al. .................... 117/84

FOREIGN PATENT DOCUMENTS
JP 2003-151907 5/2003
JP 2003-309080 10/2003
KR 10-2001-004129 A 1/2001
WO WO 02/086954 A1 10/2002
WO WO 02086954 10/2002
WO WO 03/043093 A1 5/2003

* cited by examiner

Primary Examiner — Michael Trinh
(74) Attorney, Agent, or Firm — McKenna Long & Aldridge, LLP

(57) ABSTRACT

A method of crystallizing silicon including preparing a substrate having an amorphous silicon film formed thereon, aligning a mask having a first energy region and a second energy region over a first region of the amorphous silicon film formed on the substrate, irradiating a laser beam through the first and second energy regions of the mask onto the first region of the amorphous silicon film, crystallizing the first region of the amorphous silicon film by irradiating the laser beam through the first energy region of the mask, and activating the crystallized first region by irradiating the laser beam through the second energy region.

9 Claims, 11 Drawing Sheets

METHOD OF CRYSTALLIZING SILICON

The present invention claims the benefit of Korean Patent Application No. 37738/2003 filed in Korea on Jun. 12, 2003, which is hereby incorporated by reference.

BACKGROUND OF THE INVENTION

1. Field of the Invention

The present invention relates to a method of crystallizing silicon, and more particularly, to a method of crystallizing silicon that reduces an inner grain defects.

2. Description of the Related Art

Currently, as the demand for providing information increases, various types of flat panel display devices are being developed that have slim profiles, are lightweight, and have low power consumption. Among the various types of flat panel display devices, liquid crystal display (LCD) devices are being used to provide superior color reproduction.

In general, the LCD devices include two substrates facing each other with both the two substrates having electrodes formed on the facing surfaces of the two substrates, and liquid crystal material injected into a space defined between the two substrates. Accordingly, the LCD display devices produce images by manipulating liquid crystal molecules of the liquid crystal material due to an electric field generated by voltages applied to the electrodes in order to vary light transmissibility through the liquid crystal material.

The lower substrate of the LCD device includes thin film transistor (TFTs) each provided with an active layer that is commonly formed of amorphous silicon (a-Si:H). Since the amorphous silicon can be deposited as a thin film onto a low melting point glass substrate at relatively low temperatures, it is commonly used for forming switching devices of LCD panels. However, amorphous silicon thin films deteriorate electrical characteristics and reliability of the switching devices of the LCD panels. Accordingly, amorphous silicon thin films are difficult to use in large-sized LCD screens.

For commercial application of LCD devices used in laptop computers and large-sized wall-mountable TVs, a pixel driving device having improved electric characteristics, such as high electric field effect mobility (30 cm2/Vs), radio frequency operational characteristics, and low leakage current is required. To improve these electric characteristics, high quality polycrystalline silicon (i.e., polysilicon) is required. The electric characteristics of polysilicon thin films are dependent upon grain size. For example, increasing the grain size, increases electric field effect mobility.

Various methods for crystallizing silicon into single crystalline silicon have been disclosed in PCT Publication No. WO 97/45827 and Korean Patent Laid Open Publication No. 2001-004129, which teach sequential lateral solidification (SLS) techniques for making massive single crystalline silicon structures by inducing lateral growth of silicon crystals using lasers as energy sources. The SLS technique has been developed based upon the fact that silicon grains are grown along a direction normal to a boundary surface between liquid silicon and solid silicon. The SLS technique crystallizes amorphous silicon thin film by letting the silicon grains laterally grow to predetermined lengths by appropriately adjusting laser energy intensities and laser beam projection ranges.

FIG. 1 is a schematic view of an apparatus for crystallizing silicon using an SLS technique according to the related art. In FIG. 1, an SLS apparatus 100 comprises a laser generator 111 for generating a laser beam 112, a convergence lens 113 for converging the laser beam 112 irradiated from the laser generator 111, a mask 114 for dividing the laser beam into a plurality of sections and projecting the divided sections onto a panel 116, and a scale lens 115 for reducing the laser beam 112 passing through the mask 114 to a predetermined scale.

The laser generator 111 irradiates a raw laser beam 112, the irradiated raw laser beam 112 is adjusted in its intensity while passing through an attenuator (not shown), and is then transmitted to the mask 114 through the convergence lens 113. The panel 116 is deposited with amorphous silicon, which is disposed on an X-Y stage 117, corresponding to the mask 114. At this point, to crystallize an entire area of the substrate 116, a method for gradually enlarging the crystallized area by minutely moving the X-Y stage 117 is used. Accordingly, the mask 114 is divided into laser beam transmission regions 114a, which allow for transmission of the laser beam 112, and laser beam interception regions 114b, which absorb the laser beam 112. A distance between the transmission regions 114a (i.e., a width of each interception region 114) determines a lateral grown length of the grains.

A method for crystallizing the silicon using the SLS apparatus includes forming crystalline silicon using amorphous silicon deposited onto a buffer/insulating layer (not shown), wherein the buffer layer is formed on the substrate 116. The amorphous silicon layer is deposited onto the substrate 116 by, for example, a chemical vapor deposition (CVD) process, wherein large amounts of hydrogen can be contained within the amorphous silicon layer. Since the hydrogen contained in the amorphous silicon layer is generally outdiffused from the thin film by heat, the amorphous silicon layer should undergo a dehydrogenization process through heat treatment. That is, when the hydrogen is not removed in advance from the amorphous silicon layer, the crystallized layer may become exfoliated due to rapid volume expansion of hydrogen gas contained within the amorphous silicon layer during the crystallization process.

In addition, the crystallization process using the laser cannot simultaneously crystallize the entire area of the surface. For example, since a width of the laser beam 112 and a size of the mask 114 are limited, the mask 114 must be realigned many times and the crystallization process must be repeated whenever the mask 114 is realigned in order to crystallize a large-sized screen panel. Accordingly, an area that is crystallized using the area of the mask 114 is referred to as a unit block, wherein the crystallization of the unit block should be realized by repeatedly irradiating the laser beam.

FIG. 2 is a silicon crystallization diagram according to the related art. In FIG. 2, a first regime on the diagram represents a partial melting region in which only a surface portion of silicon is melted to form small-sized grains. A second regime represents a nearly complete melting region in which larger grains than the first regime can be formed. However, it is difficult to obtain uniform sized grains. A third regime represents a completely melting region in the amorphous silicon is completely melted and fine grains are formed by homogeneous nucleation.

According to the related art, crystallizing silicon using the SLS technique is performed within the completely melting region (i.e., third regime) in which amorphous silicon is completely melted by laser crystallization.

FIG. 3 is a schematic plan view of a mask for crystallizing silicon using the SLS technique according to the related art. In FIG. 3, a mask 114 comprises patterned transmission and interception regions 114a and 114b, where each of the transmission regions 114a is defined by a longitudinal slot extending along a first direction. A width "d" of the transmission region 114a is designed to be less than twice as long as a maximum length of a grain grown by a first laser irradiated process. When the first laser beam is irradiated through the mask 114, grains are laterally grown from both boundaries of the molten amorphous silicon within the melting regions of the amorphous silicon layer, which correspond to the transmission regions 114a of the mask 114 until boundaries of the laterally grown grains collide with each other at a middle line of a liquid phase.

During the crystallization process, the beam pattern passes through the mask 114 and is reduced by a scale lens 115 (in FIG. 1) that moves along an X-axis direction. Accordingly, the crystallization process proceeds while the laser pattern moves in units of hundreds of μm (i.e., a length of a pattern reduced by the scale lens 115).

FIGS. 4A to 4D are cross sectional views of the SLS technique according to the related art. In FIGS. 4A to 4D, a 2-shot SLS polysilicon crystallization method is described, wherein three transmission patterns (regions) are defined on the mask. In the 2-shot polysilicon crystallization method, regions of the amorphous silicon layer that correspond to the transmission regions are crystallized by irradiating the laser beam twice. In addition, the crystallization process is consecutively carried out along a lengthwise direction of a substrate. When the crystallization is completed along the lengthwise direction of the substrate, the laser pattern minutely moves along a widthwise direction, and then moves along the lengthwise direction to proceed with the crystallization, thereby completing the crystallization process for the desired region.

In FIG. 4A, the mask 114 (in FIG. 3) is first located corresponding to the substrate, and the first laser beam is irradiated to proceed with the crystallization process for the amorphous silicon layer deposited onto the substrate. The irradiated laser beam is divided into a plurality of sections while passing through the plurality of slits 114a (in FIG. 3) formed in the mask 114. Accordingly, regions of the amorphous silicon layer, which correspond to the slits 114a, are liquefied by the divided sections of the first laser beam. In this case, laser energy intensity is set to be within a completely melting region in which the amorphous silicon layer can become completely molten.

When the laser beam irradiation is completed, silicon grains are laterally grown at a boundary between the solid amorphous silicon region and the liquefied amorphous silicon region. A width of the beam pattern passing through the mask is set to be less than twice as long as a length of the grown grains, and the crystallized regions correspond to the transmission regions 114a (in FIG. 2) of the mask. Accordingly, each of the crystallized regions A1, A2, and A3 has a length identical to that of each of the transmission regions 114a. In addition, regions of the amorphous silicon layer, which correspond to the interception regions 114b (in FIG. 2) of the mask, remain as amorphous silicon regions 167.

Accordingly, the grains 166a and 166b are laterally grown from the boundaries between the liquefied silicon and the solid silicon within the crystallized regions A1, A2, and A3, thereby defining a grain boundary, as shown in FIGS. 4A to 4C.

Next, the crystallization process is consecutively carried out along an X-axis direction while the stage upon which the substrate is disposed moves by units of hundreds of μm that are as long as a length of the mask pattern (beam pattern). In FIG. 4B, when the first crystallization along the X-axis direction (i.e., horizontal direction) is completed, the mask 114 on the X-Y stage 117 (in FIG. 1) is minutely moved along a Y-axis direction (i.e., vertical direction). Next, a second laser irradiation is initiated from a point where the first crystallization is finished along the X-axis direction. Accordingly, the grains of the crystallized silicon formed by the first laser irradiation are further consecutively grown by the second laser irradiation. For example, the grains are further grown to have a length that is one-half as long as a distance "k" from the grain boundary 166c of the crystallized region A1 to the grain boundary of the adjacent crystallized region A2.

In FIG. 4C, a polysilicon thin film formed of the grains 168a and 168b having a predetermined length can be formed. Accordingly, within newly crystallized regions B1 and B2, grains 168a and 168b are vertically grown from the boundaries between the liquefied silicon and the solid silicon. The grains 168a and 168b are further grown until they contact each other, thereby defining a new grain boundary 168c, as shown in FIG. 4D.

Although the method of crystallizing amorphous silicon using the SLS technique is performed within the complete melting regime corresponding to a region where amorphous silicon is completely melted, many defects 169 (in FIG. 4D) are contained within large-sized grains. These defects 169 (in FIG. 4D) are repaired by a second Excimer laser annealing (ELA) process within the near complete melting region having a lower energy than the completely melting region. However, the method using first a laser with a high energy and then using a laser with a low energy as an additive process increases total processing time, thereby decreasing process yield.

SUMMARY OF THE INVENTION

Accordingly, the present invention is directed to a method of crystallizing silicon that substantially obviates one or more problems due to limitations and disadvantages of the related art.

An object of the present invention to provide a method of crystallizing silicon using an SLS method to obtain good quality grains.

Additional features and advantages of the invention will be set forth in part in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described, a method of crystallizing silicon including preparing a substrate having an amorphous silicon film formed thereon, aligning a mask having a first energy region and a second energy region over a first region of the amorphous silicon film formed on the substrate, irradiating a laser beam through the first and second energy regions of the mask onto the first region of the amorphous silicon film, crystallizing the first region of the amorphous silicon film by irradiating the laser beam through the first energy region of the mask, and activating the crystallized first region by irradiating the laser beam through the second energy region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

According to the present invention, single scan technology may be used for crystallizing a desired region of an amorphous silicon layer through a laser beam scan along a first direction by dividing a laser mask into N+1 blocks spaced apart by a predetermined interval from one another, and deforming patterns of a transmission region and an interception region of each of the divided N+1 blocks.

Figure 1:
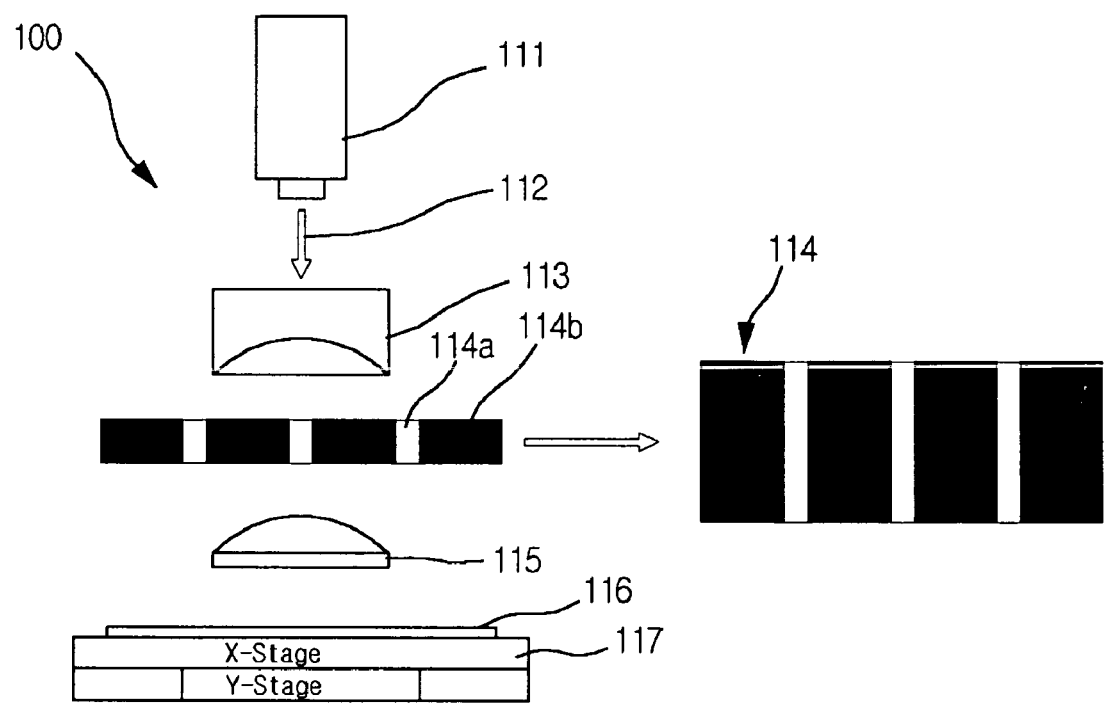
FIG. 1 is a schematic view of an apparatus for crystallizing silicon using an SLS technique according to the related art.
Figure 2:
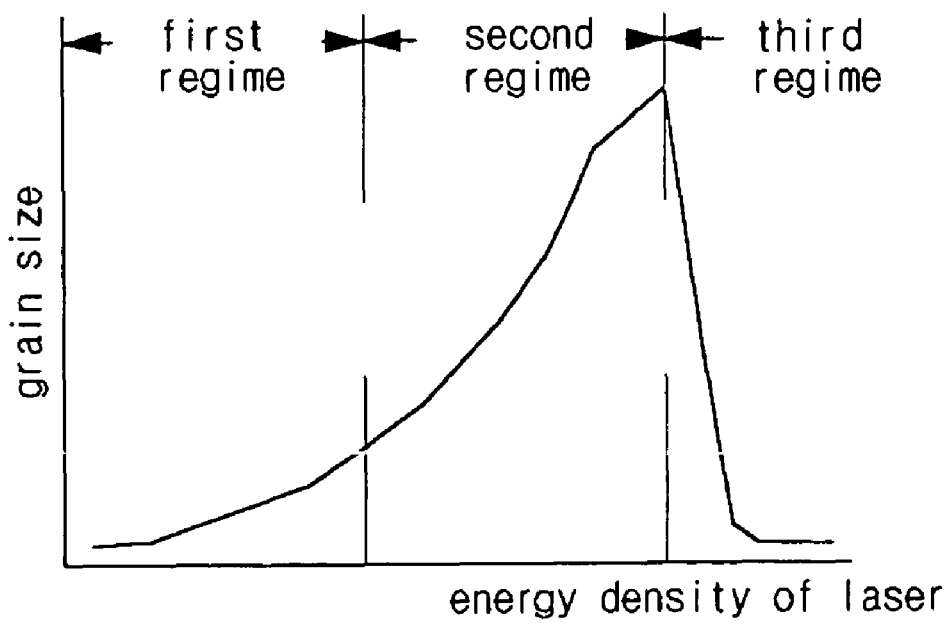
FIG. 2 is a silicon crystallization diagram according to the related art.
Figure 3:
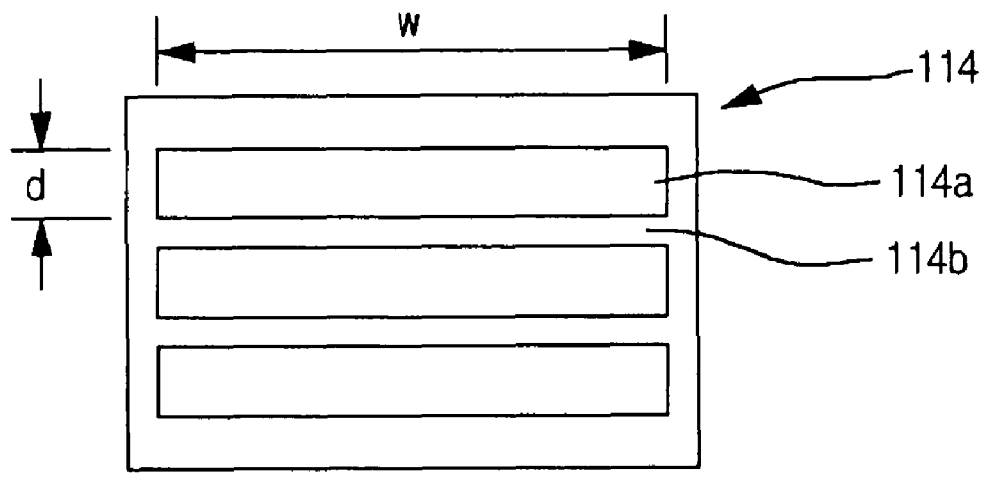
FIG. 3 is a schematic plan view of a mask for crystallizing silicon using the SLS technique according to the related art.
Figure 4A:
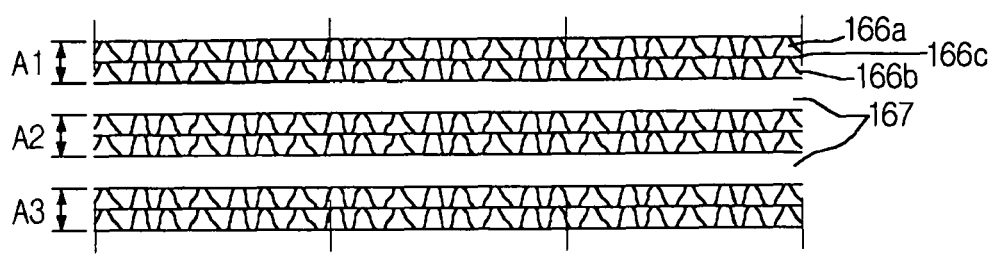
FIGS. 4A to 4D are cross sectional views of the SLS technique according to the related art.
Figure 4B:
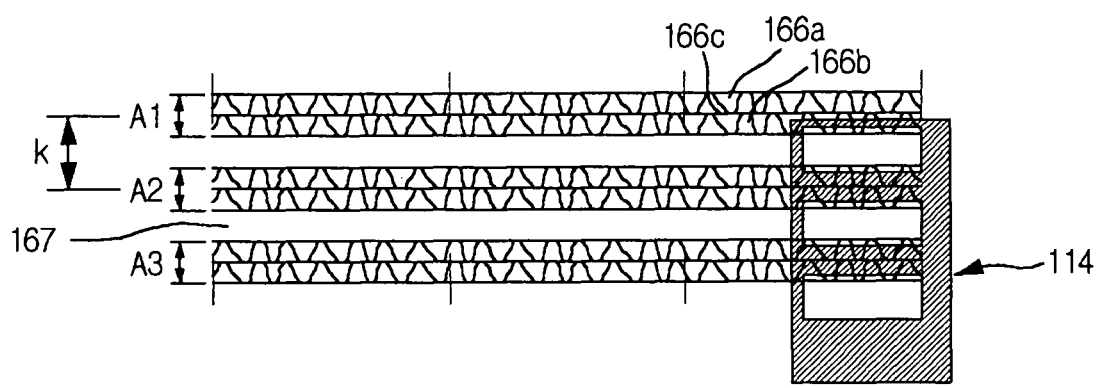
Figure 4C:
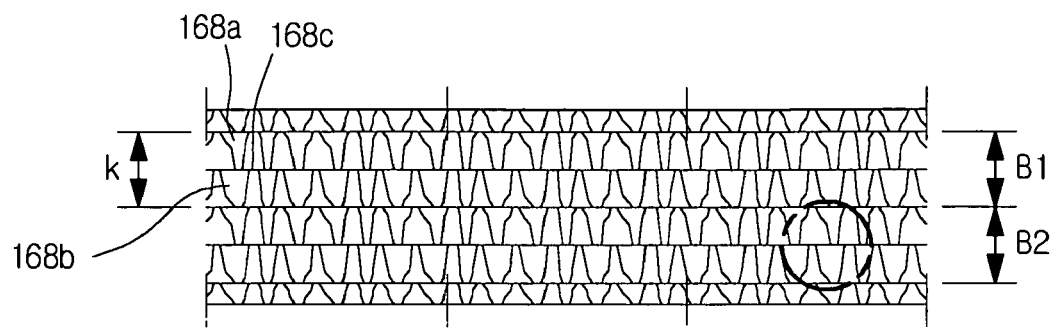
Figure 4D:
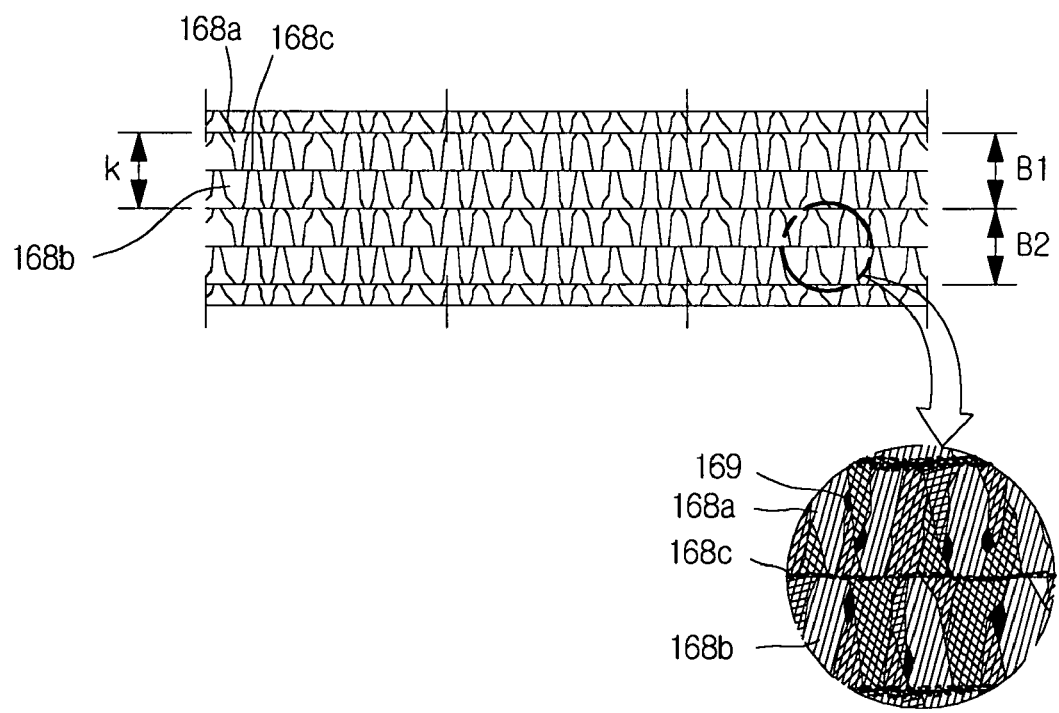
Figure 5:
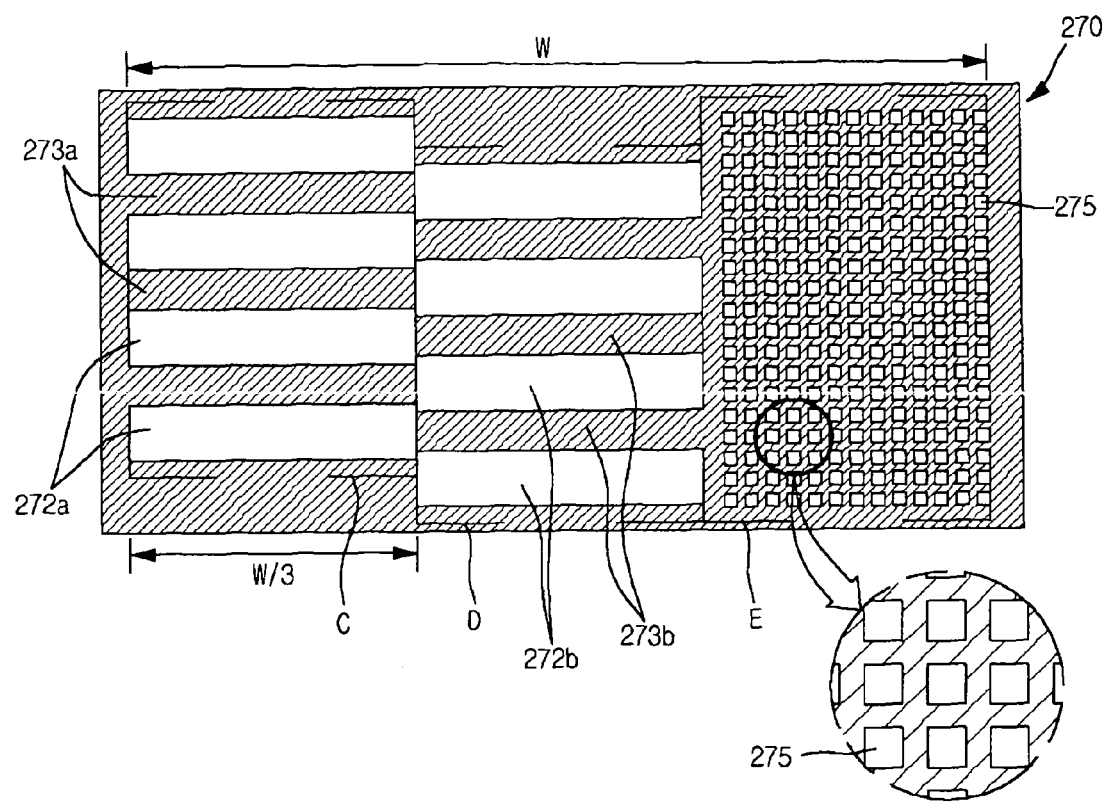
FIG. 5 is a schematic plan view of an exemplary mask according to the present invention.

FIG. 5 is a schematic plan view of an exemplary mask according to the present invention. In FIG. 5, a mask 270 may include a first block C having a plurality of transmission patterns 272a spaced apart by a predetermined interval from one another, and a second block D having a plurality of transmission patterns 272b similar to the transmission patterns 272a of the first block C. The transmission patterns 272b of the second block D may be configured to correspond to interception regions 273a disposed between the transmission patterns 272a of the first block C, and may be composed of an activation region E having a plurality small rectangular slits.

Accordingly, by using the mask 270, a desired portion of an amorphous silicon layer may be completely melted by the transmission patterns 272a and 272b of the first and second blocks C and D during irradiation of a laser beam having a high energy band. Thus, portions of the amorphous silicon layer may be laterally crystallized while melted portions of the amorphous silicon layer may be solidified.

In FIG. 5, when a stage is displaced along a lengthwise direction, an activation region E may be located on a crystallized region created by the first block C and second block D of the mask 270. Then, when a laser beam with a high energy band is irradiated through the mask 270, the laser beam may be diffracted while passing through the small rectangular slits 275 of the activation region E and may be changed into a laser beam with a low energy band. Accordingly, when the mask 270 with the transmission patterns 272a and 272b is moved along the lengthwise direction by a length of W/3, the transmission patterns 272b of the second block D may be located over the amorphous silicon corresponding to the interception region 273a disposed between the transmission patterns 272a of the first block C. Then, when the stage is again moved along the lengthwise direction by the length of W/3, the activation region E of the mask 270 may be located over the crystallization region where the first and second blocks C and D were located. Thus, by moving the stage along the lengthwise direction and performing the crystallization along the lengthwise direction using the mask 270, crystallization and recrystallization of a desired region may be completed by a single processing scan.

In FIG. 5, widths of the transmission patterns 272a and 272b may be designed to be equal to or less than twice as long as a maximum length of a grain grown by irradiation of a single laser beam. The plurality of small rectangular slits 275 formed in the activation region E may change the energy level of the laser beam from a high energy band to a low energy band such that a laser beam with a low energy density may be irradiated onto the amorphous silicon. Thus, the activation region E may allow the polysilicon crystallized by the two blocks mask to be recrystallized and activated, thereby repairing defects within the grains.

Figure 6A:
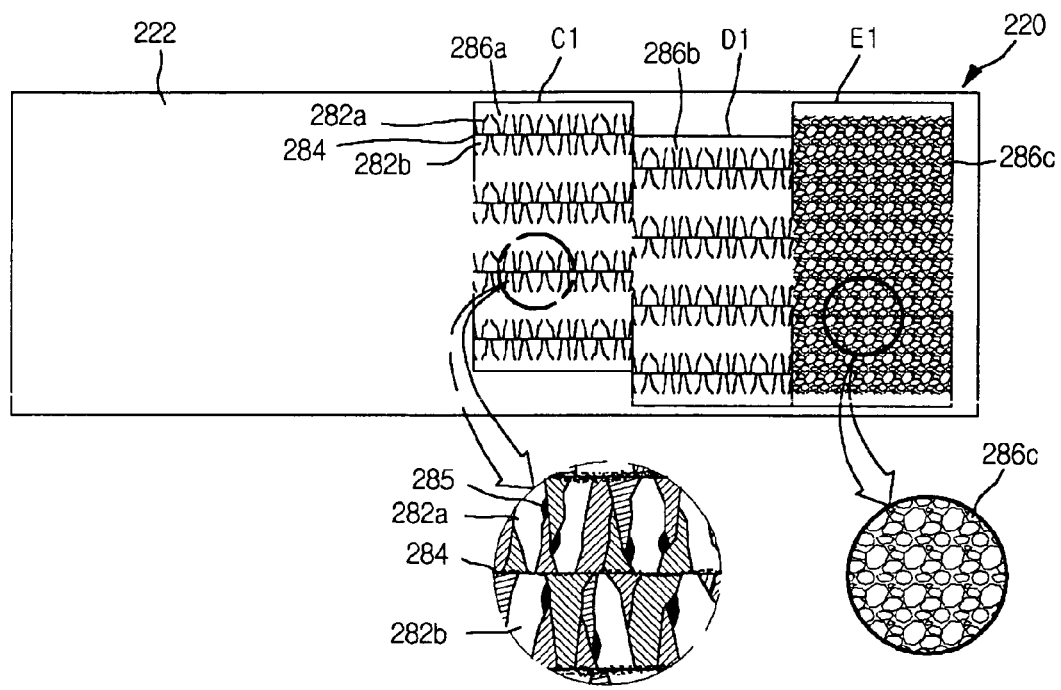
FIGS. 6A to 6E are cross sectional views of an exemplary method of crystallizing silicon according to the present invention.

FIGS. 6A to 6E are cross sectional views of an exemplary method of crystallizing silicon according to the present invention. In FIG. 6A, a buffer layer (not shown) may be formed on a substrate 220, and an amorphous silicon film 222 may be deposited on the buffer layer. Then, the amorphous silicon layer 222 may undergo a first heat treatment to perform a dehydrogenation process. Next, a mask 270 (in FIG. 5) may be positioned over the substrate 220 an aligned with the amorphous silicon layer 222. Then, a first laser beam may be irradiated onto the substrate 220 having the amorphous silicon film 222 formed thereon such that beam patterns corresponding to the transmission patterns 272a and 272b (in FIG. 5) may be irradiated onto the amorphous silicon film 222. Accordingly, first regions 286a and 286b irradiated with the first laser beam may be completely melted. Then, as a temperature of the amorphous silicon film 222 decreases, grains may be grown from both boundaries of the melted regions of the amorphous silicon layer, thereby forming a first grain region 282a, a second grain region 282b, and a grain boundary 284 where the first and second grain regions 282a and 282b meet with each other.

As shown in FIG. 6A, during the crystallization of the amorphous silicon within the grain regions 282a and 282b, portions of the amorphous silicon that are completely melted may begin to crystallize using dissolved portions of the amorphous silicon of both regions as seeds. For example, the grains 282a and 282b may be grown from an upper side and a lower side, as seen in the first enlarged view of FIG. 6A, and the boundaries 284 of the grains 282a and 282b may be formed at mid portions of a region.

As a result of the first irradiation of the laser beam, a first crystallization group region C1 including a plurality of crystallized regions 286a and corresponding to the transmission patterns 272a of the first block C of the mask 270 (in FIG. 5), and a second crystallization group region D1 including a plurality of crystallized regions 286a and corresponding to the transmission patterns 272b of the second block D of the mask 270 (in FIG. 5) may be formed. Accordingly, the first crystallized regions 286a and the second crystallized regions 286b may have similar areas and shapes. In addition, as shown in the first enlarged view of FIG. 6A, the large grains 282a and 282b grown laterally within the completely melting region may have many inner defects 284.

As shown in FIG. 5, the small rectangular slits 275 formed in the activation region E may diffract the laser beam passing therethrough so that the laser beam has a low energy. Accordingly, when the laser beam having a high energy band is irradiated through the mask 270, the amorphous silicon film 222 (in FIG. 6A) corresponding to the activation region E of the mask 270 may be crystallized within the near completely melting region. As a result, with respect to the first block C (in FIG. 5), the first crystallization group region C1 including the plurality of crystallized regions 286a and corresponding to the transmission patterns 272a of the first block C of the mask 270 (in FIG. 5), the second crystallization group region D1 including the plurality of crystallized regions 286a and corresponding to the transmission patterns 272b of the second block D of the mask 270 (in FIG. 5), and a third crystallization region group E1 including a plurality of a plurality of third crystallized regions 286c may be formed.

In addition, the first crystallized regions 286a and the second crystallized regions 286b may have similar shapes, and the laser beam having a uniform high energy band may be irradiated onto an identical area of the first crystallized regions 286a and the second crystallized regions 286b. Moreover, the third crystallized region 286c may be crystallized by using an excimer laser annealing (ELA) processing using a an excimer laser having a comparatively low energy level.

As shown in the first enlarged view of FIG. 6A, the first and second crystallized regions 286a and 286b may have laterally-grown large-sized grains within the completely melting region. However, the plurality of defects 285 may deteriorate electrical characteristics.

Figure 6B:
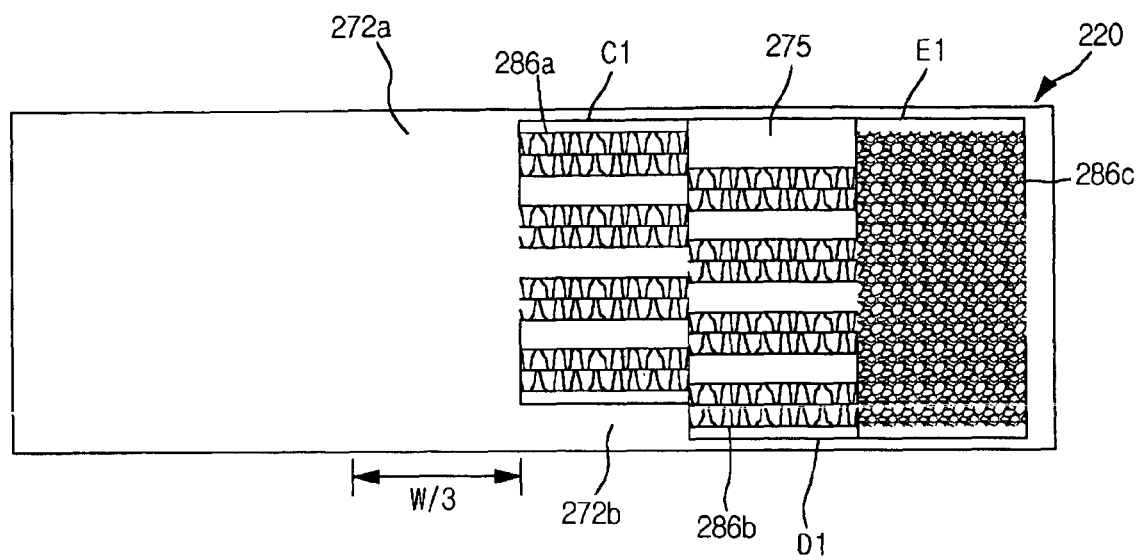

In FIG. 6B, the mask 270 (in FIG. 5) may remain fixed, and the stage beneath the substrate 220 may be moved along the lengthwise direction by the length W/3 of the first crystallized region 286a. Accordingly, the plurality of transmission patterns 272b of the second block D may be located over the first crystallization region group C1, which was crystallized by the first irradiation of the laser beam. In addition, the rectangular slits 275 of the activation region E of the mask 270 (in FIG. 5) may be located over the second crystallization region group D1 that was partially crystallized by the first irradiation of the laser beam. Then, a second laser beam may be irradiated through the mask 270 (in FIG. 5) so that the amorphous silicon corresponding to the transmission patterns 272a of the first block C of the mask may be completely melted and then crystallized. The grains of the amorphous silicon partially crystallized by the first irradiation of the laser beam corresponding to the transmission patterns 272b of the second block D of the mask 270 (in FIG. 5) disposed above the first crystallization region group C1 may be continuously further grown from the boundaries. For example, the grains of the newly crystallized region formed by the first radiation of the laser beam may be again grown as grains having a length corresponding to one-half of a distance between adjacent grain boundaries where the grains collide with each other. In addition, the second crystallized region 286b corresponding to the activation region E of the mask 270 (in FIG. 5) may including rectangular slits 275 may be recrystallized (or activated) by a laser beam having a low energy band, thereby repairing the defects 285 (in FIG. 6A).

Figure 6C:
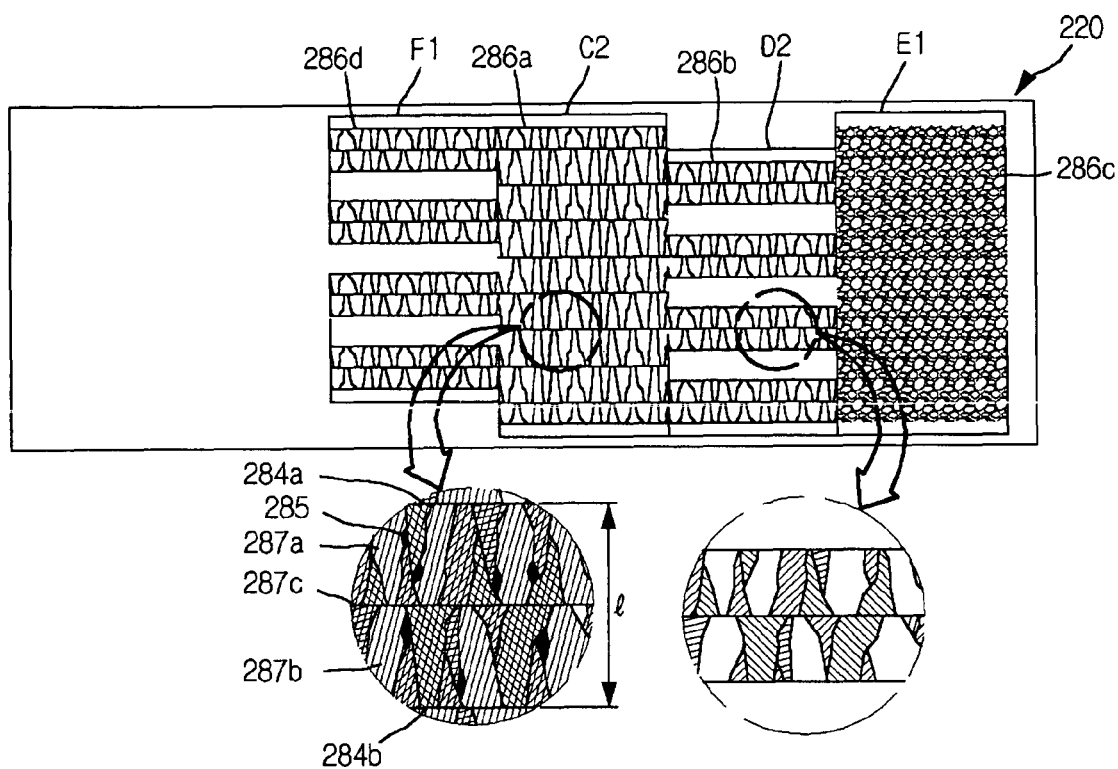

In FIG. 6C, the first crystallization region group C1 formed by the first irradiation of the laser beam may form a crystallization region group C2 having good quality grains, and at the same time a fourth crystallization region group F1 including a fourth crystallized region 286d may be formed. Accordingly, the grains 287a and 287b formed within the crystallization region C2 may be regrown by one-half of a distance between a grain boundary 284a formed by the first irradiation of the laser beam and an adjacent grain boundary 284b, thereby forming a new grain boundary 287c at a mid portion. In addition, as shown in a second enlarged view of FIG. 6C, when the ELA process of irradiating a second laser beam is performed with respect to the second crystallization region group D2 corresponding to the activation region E of the mask 270 (in FIG. 5), interior ones of the grains may be activated and recrystallized, thereby repairing the defects 285, as shown in a first enlarged view of FIG. 6C.

Figure 6D:
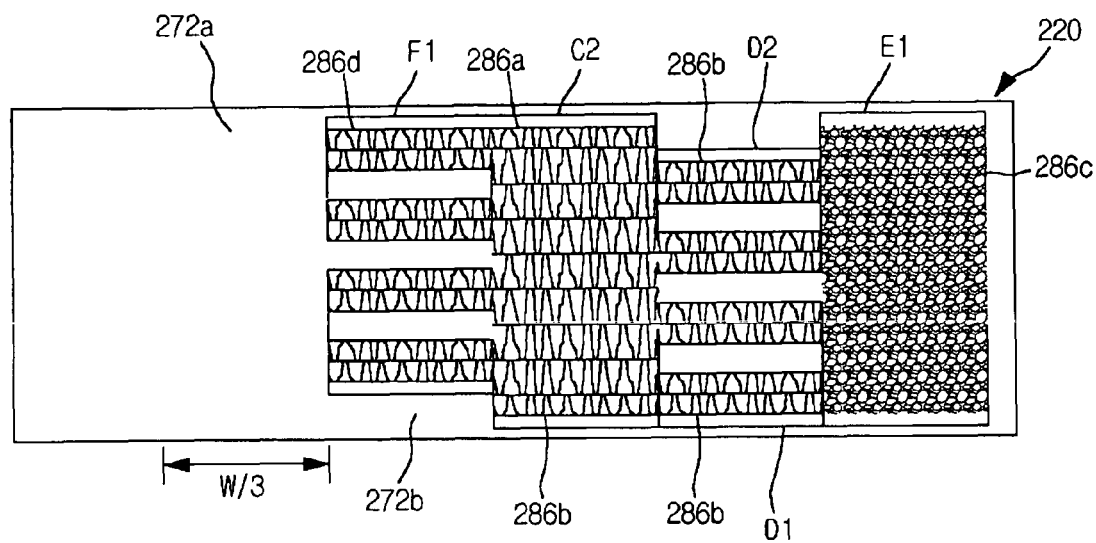

In FIG. 6D, when the stage is moved along the lengthwise direction by the length of W/3 of the transmission patterns 272a and 272b of the mask 270 (in FIG. 5), the transmission patterns 272a of the first block C of the mask 270 (in FIG. 5) may be located over a new portion of the amorphous silicon film, and the transmission patterns 272b of the second block D may be located over the fourth crystallization region group F1 crystallized by the two irradiations of the laser beams. In addition, the activation region E having the plurality of small slits 275 (in FIG. 5) may be located over the completely crystallization region C2. Accordingly, when a third laser beam is irradiated through the mask 270, the new amorphous silicon corresponding to the transmission patterns 272a of the first block C of the mask 270 may be crystallized, thereby forming a fifth crystallization region group G1.

Figure 6E:
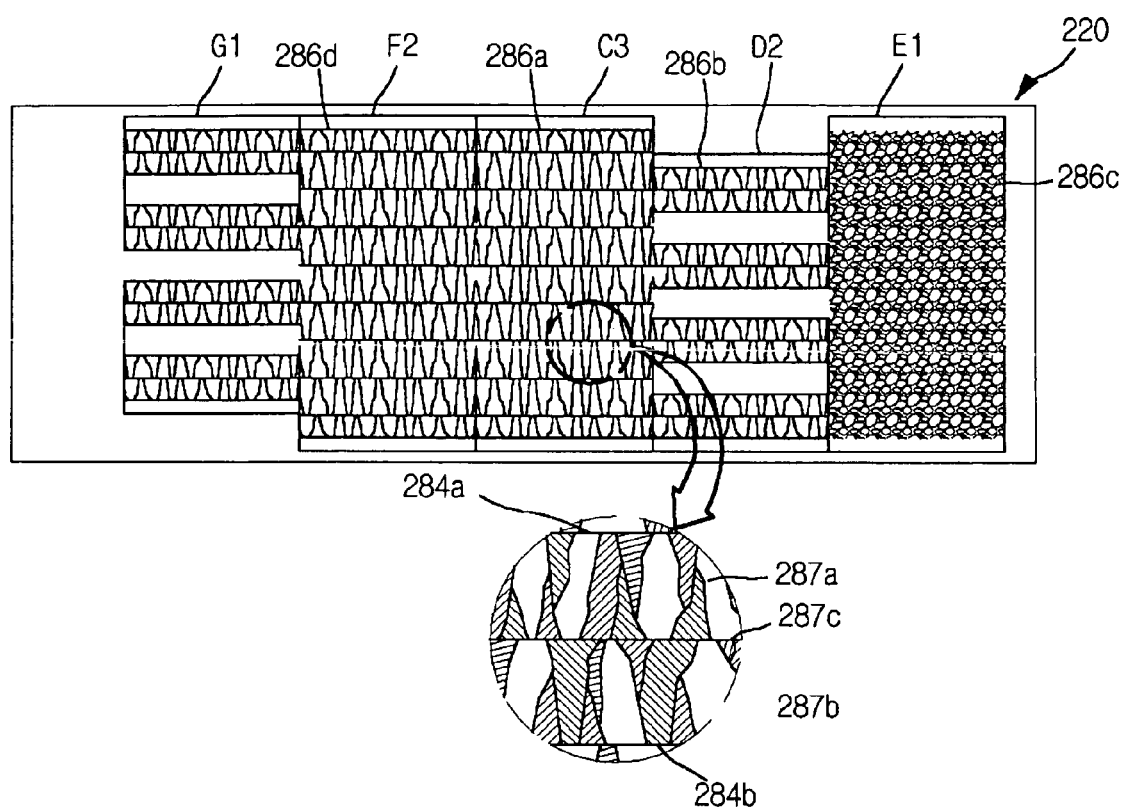

In FIG. 6D, the fourth crystallization region group F1 corresponding to the second block D of the mask 270 may be crystallized so that the grains formed in the fourth crystallization region group F1 may be continuously grown from adjacent boundaries, thereby forming a complete crystallization region F2 where the amorphous silicon is completely crystallized. In FIG. 6E, for example, the grains of the fourth crystallization region group F1 may be regrown as grains having a length corresponding to one-half a length from a portion where the grains collide to a portion of adjacent boundaries. Thus, the first crystallization region C2 corresponding to the activation region E of the mask 270 (in FIG. 5) including the plurality of rectangular slits may be crystallized (or activated) to repair defects 285 (in FIG. 6C) of large-sized grains, thereby forming a complete crystallization region C3 having good quality grains, as shown in FIG. 6E.

By repeating the processes shown in FIGS. 6A to 6E, a polysilicon thin film having complete crystallization regions may be obtained. While the crystallization for forming the polysilicon thin film may be performed by moving the stage, it may be possible to perform the crystallization by moving the mask or by simultaneously moving the mask and the stage.

Figure 7:
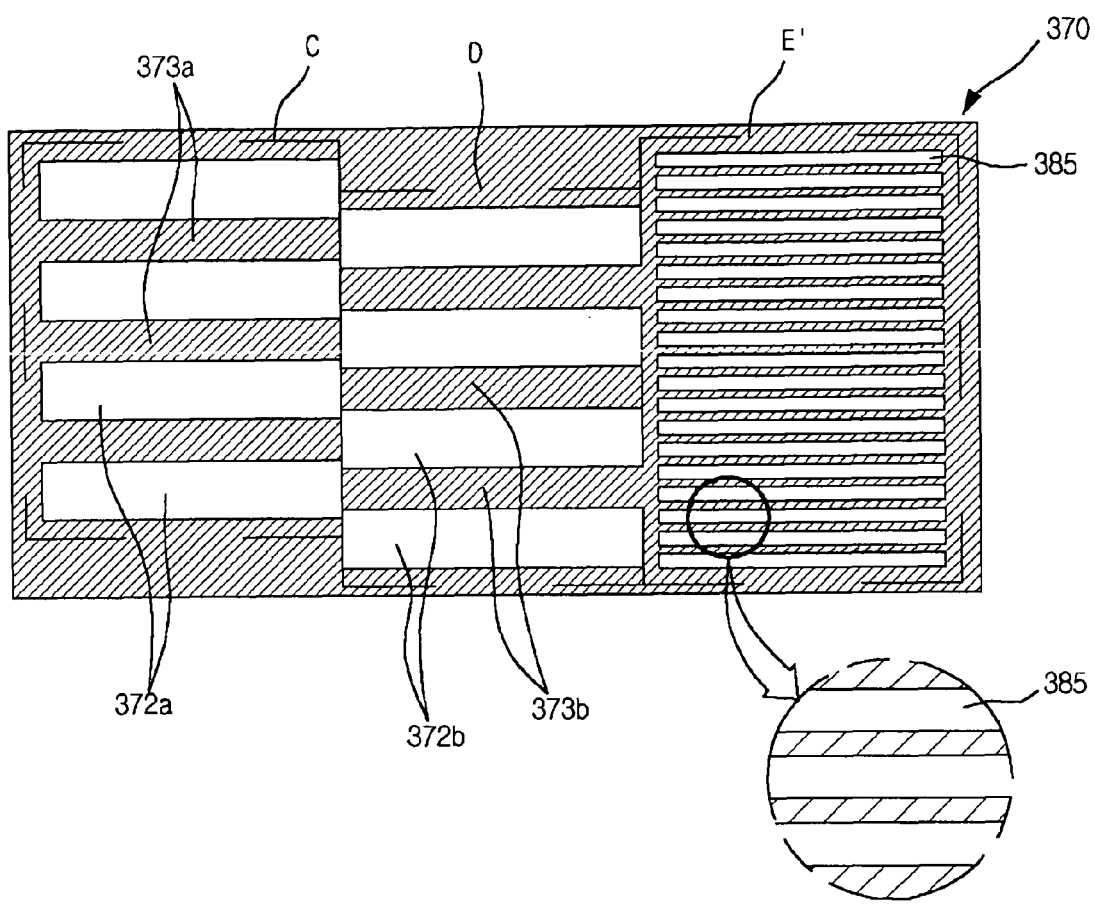
FIG. 7 is a schematic plan view of another exemplary mask according the present invention.

FIG. 7 is a schematic plan view of another exemplary mask according the present invention. In FIG. 7, using a laser mask 370 for an SLS process, an area of a laser beam may be divided into three regions of a first block, a second block, and an activation region. For example, a mask 370 may include a first block C having a plurality of transmission patterns 372a spaced apart by a predetermined interval from one another along a vertical direction, and a second block D having a plurality of transmission patterns 372b similar to the transmission patterns 372a of the first block C. The transmission patterns 372b of the second block D may be provided within a second block mask corresponding to intervals disposed between the transmission patterns 372a of the first block C. In addition, the mask 370 may include an activation region E' having a plurality small slits, each having a length of W/3, formed along a lengthwise direction. The activation region E' may partially transmit a laser beam so that the laser beam may be irradiated onto an amorphous silicon film with a low energy level.

According to the present invention, the SLS crystallizing method may use an N-number of mask blocks. For example, when using the N-number of mask blocks, an area of a laser beam may be divided into an (N+1)-number of mask blocks, wherein the $N^{th}$-number mask block may correspond to an SLS crystallization region having a high energy density and the $(N+1)^{th}$-number mask block may become an activation region having a low energy density. Accordingly, crystallizing silicon using an SLS technique according to the present invention, a laser mask may be divided into the (N+1)-number of mask blocks, wherein the $(N+1)^{th}$ mask block may partially transmit a laser beam and may include a plurality of narrow slits, thereby reducing an energy density of the laser beam passing therethrough. Thus, a laser beam having a high energy level and a laser beam having a low energy level may be simultaneously obtained during a single laser annealing process. Moreover, defects of a crystallized film generated by the high energy laser beam may be activated and repaired by the low energy laser beam, thereby forming a good quality polysilicon thin film without decreasing process yield.

It will be apparent to those skilled in the art that various modifications and variations can be made in the method of crystallizing silicon of the present invention without departing from the spirit or scope of the invention. Thus, it is intended that the present invention cover the modifications and variations of this invention provided they come within the scope of the appended claims and their equivalents.

What is claimed is:

1. A method of crystallizing silicon, comprising:
    preparing a substrate having an amorphous silicon film formed thereon;
    aligning a mask having a first energy region and a second energy region on the amorphous silicon film, wherein the first energy region includes a plurality of transmission patterns and a plurality of interception regions;
    irradiating a laser beam through the first and second energy regions of the mask onto a first region of the amorphous silicon film corresponding to the transmission patterns and a second region of the amorphous silicon film corresponding to the second energy regions;
    crystallizing the first region of the amorphous silicon film within a completely melting region by the laser beam irradiated through the first energy region of the mask and the second region of the amorphous silicon film within a near completely melting region by the laser beam irradiated through the second energy region of the mask, wherein an energy density of the near complete melting region is between an energy density of a partially melting region and an energy density of the completely melting region;
    moving a relative position of the mask by the length of the transmission pattern; and
    activating the crystallized first region by irradiating the laser beam through the second energy region to repair a defect of the crystallized first region.

2. The method according to claim 1, wherein the second energy region includes smaller slits than the transmission patterns.

3. The method according to claim 1, wherein the laser beam irradiated through the first energy region has a first energy and the laser beam irradiated through the second energy region has a second energy lower than the first energy.

4. The method according to claim 1, wherein the laser beams irradiated through the first and second energy regions having uniform energy levels.

5. The method according to claim 1, wherein the second energy region of the mask diffracts the irradiated laser beam.

6. The method according to claim 1, further comprising moving one of the mask and the substrate to align the mask having the first energy region and the second energy region over a second region of the amorphous silicon film.

7. The method according to claim 1, wherein the first energy region of the mask includes a plurality of crossing stripe patterns.

8. The method according to claim 7, wherein the first energy region has a height that is less than or equal to a maximum grain growth length during a irradiating of the laser beam.

9. The method according to claim 1, wherein the second energy region of the mask is disposed at an end region of the mask with respect to an advancing direction of the mask.

* * * * *